United States Patent
Zhang et al.

(10) Patent No.: US 11,966,715 B2
(45) Date of Patent: *Apr. 23, 2024

(54) THREE-DIMENSIONAL PROCESSOR FOR PARALLEL COMPUTING

(71) Applicants: Guobiao Zhang, Corvallis, OR (US); Chen Shen, SuZhou (CN)

(72) Inventors: Guobiao Zhang, Corvallis, OR (US); Chen Shen, SuZhou (CN)

(73) Assignees: HangZhou HaiCun Information Technology Co., Ltd., ZheJiang (CN); Guobiao Zhang, Corvallis, OR (US)

( * ) Notice: Subject to any disclaimer, the term of this patent is extended or adjusted under 35 U.S.C. 154(b) by 900 days.

This patent is subject to a terminal disclaimer.

(21) Appl. No.: 16/939,048

(22) Filed: Jul. 26, 2020

(65) Prior Publication Data

US 2020/0356345 A1 Nov. 12, 2020

Related U.S. Application Data

(63) Continuation-in-part of application No. 16/458,187, filed on Jun. 30, 2019, now Pat. No. 11,080,229, and
(Continued)

(30) Foreign Application Priority Data

Feb. 13, 2016 (CN) .......................... 201610083747.7
Apr. 22, 2016 (CN) .......................... 201610260845.3
(Continued)

(51) Int. Cl.
*G06F 7/57* (2006.01)
*G06F 7/544* (2006.01)
(Continued)

(52) U.S. Cl.
CPC ................ *G06F 7/57* (2013.01); *G06F 7/544* (2013.01); *G06F 9/3001* (2013.01);
(Continued)

(58) Field of Classification Search
CPC ........ G06F 7/57; G06F 7/544; G06F 16/9017; G06F 9/3001; G06F 9/3877
See application file for complete search history.

(56) References Cited

U.S. PATENT DOCUMENTS 4,870,302 A 9/1989 Freeman
5,046,038 A 9/1991 Briggs et al.
(Continued)

OTHER PUBLICATIONS

Muhammad Kamran, "MSDCT Architecture Implementation with DA Based Optimized LUT," Jun. 21-23, 2006, Department of Computer Science and Engineering, Beijing Institute of Technology, pp. 10008-10012 (Year: 2006).*
(Continued)

*Primary Examiner* — Michael D. Yaary

(57) ABSTRACT

A three-dimensional processor (3D-processor) for parallel computing includes a plurality of computing elements. Each computing element comprises at least a three-dimensional memory (3D-M) array for storing at least a portion of a look-up table (LUT) for a mathematical function and an arithmetic logic circuit (ALC) for performing arithmetic operations on the LUT data. Deficiency in latency is offset by a large scale of parallelism.

20 Claims, 13 Drawing Sheets

Related U.S. Application Data a continuation-in-part of application No. 15/487,366, filed on Apr. 13, 2017, now Pat. No. 10,763,861, said application No. 16/458,187 is a continuation-in-part of application No. 15/487,366, filed on Apr. 13, 2017, now Pat. No. 10,763,861.

(30) Foreign Application Priority Data

| May 2, 2016 | (CN) | ......................... 201610289592.2 |
| Apr. 12, 2017 | (CN) | ......................... 201710237780.5 |

(51) Int. Cl.
  *G06F 9/30* (2018.01)
  *G06F 9/38* (2018.01)
  *G06F 16/901* (2019.01)
  *H10B 41/27* (2023.01)

(52) U.S. Cl.
  CPC ........ *G06F 9/3877* (2013.01); *G06F 16/9017* (2019.01); *H10B 41/27* (2023.02)

(56) References Cited

U.S. PATENT DOCUMENTS

| 5,060,182 | A | 10/1991 | Briggs et al. |
| 5,604,499 | A | 2/1997 | Miyagoshi et al. |
| 5,835,396 | A | 11/1998 | Zhang |
| 5,901,274 | A | 5/1999 | Oh |
| 5,954,787 | A | 9/1999 | Eun |
| 6,181,355 | B1 | 1/2001 | Brethour et al. |
| 6,263,470 | B1 | 7/2001 | Hung et al. |
| 7,028,247 | B2 | 4/2006 | Lee |
| 7,206,410 | B2 | 4/2007 | Bertoni et al. |
| 7,366,748 | B1 | 4/2008 | Tang et al. |
| 7,472,149 | B2 | 12/2008 | Endo |
| 7,512,647 | B2 | 3/2009 | Wilson et al. |
| 7,574,468 | B1 | 4/2009 | Rayala |
| 7,539,927 | B2 | 5/2009 | Lee et al. |
| 7,634,524 | B2 | 12/2009 | Okutani et al. |
| 7,962,543 | B2 | 6/2011 | Schulte et al. |
| 8,203,564 | B2 | 6/2012 | Jiao et al. |
| 8,487,948 | B2 | 7/2013 | Kai et al. |
| 9,015,452 | B2 | 4/2015 | Dasgupta |
| 9,207,910 | B2 | 12/2015 | Azadet et al. |
| 9,225,501 | B2 | 12/2015 | Azadet |
| 9,465,580 | B2 | 10/2016 | Pineiro et al. |
| 9,606,796 | B2 | 3/2017 | Lee et al. |
| 2004/0044710 | A1 | 3/2004 | Harrison et al. |
| 2006/0106905 | A1 | 5/2006 | Chren |
| 2014/0067889 | A1 | 3/2014 | Mortensen |

OTHER PUBLICATIONS

Harrison et al., "The Computation of Transcendental Functions on the IA-64 Architecture", Intel Technical Journal, Q4, 1999.

Karam et al, "Emerging Trends in Design and Applications of Memory-Based Computing and Content-Addressable Memories", Proceedings of the IEEE, vol. 103, issue 8, pp. 1311-1330, 2015.

"Arithmetic", Wikipedia, https://en.wikipedia.org/wiki/Arithmetic, Jun. 30, 2019.

"Operation (Mathematics)", Wikipedia, https://en.wikipedia.org/wiki/Operation_(mathematics), Jun. 30, 2019.

* cited by examiner

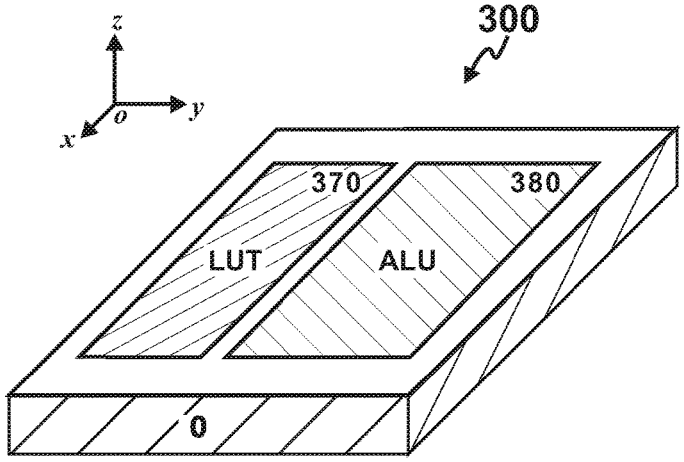
Fig. 1A
(Prior Art)
| FUNC | LUT SIZE | Taylor Series |
|---|---|---|
| CBRT | 24 kbit | 6 |
| EXP | 2 kbit | 5 |
| LN | 24 kbit | 6 |
| SIN | 6 kbit | 9 |
| COS | 6 kbit | 9 |
| TAN | 0 | 15 |
| ATAN | 0 | 22 |
Fig. 1B
(Prior Art)
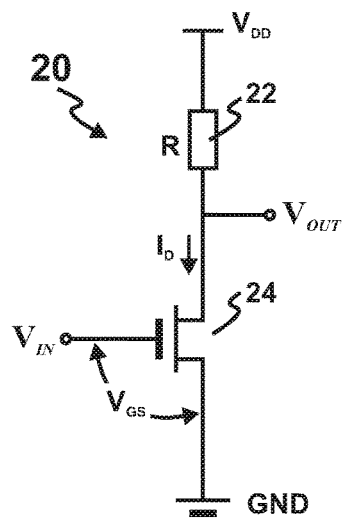
Fig. 2A
(Prior Art)
| # of ops. \ Model Name | MOS3 | BSIM3 V3.2 | BSIM4 V3.0 | PSP |
|---|---|---|---|---|
| Addition | 46 | 283 | 222 | 1345 |
| Multiplication | 82 | 634 | 286 | 2319 |
| Division | 20 | 122 | 85 | 247 |
| Square Root | 4 | 9 | 16 | 30 |
| Exponential | 3 | 8 | 24 | 19 |
| Logarithmic | 0 | 1 | 19 | 10 |
Fig. 2B
(Prior Art)

THREE-DIMENSIONAL PROCESSOR FOR PARALLEL COMPUTING

CROSS-REFERENCE TO RELATED APPLICATIONS

This application is a continuation-in-part of U.S. patent application Ser. No. 15/487,366, filed Apr. 13, 2017. This application is further a continuation-in-part of U.S. patent application Ser. No. 16/458,187, filed Jun. 30, 2019, which is also a continuation-in-part of U.S. patent application Ser. No. 15/487,366, filed Apr. 13, 2017.

These applications claim priorities from Chinese Patent Application 201610083747.7, filed on Feb. 13, 2016; Chinese Patent Application 201610260845.3, filed on Apr. 22, 2016; Chinese Patent Application 201610289592.2, filed on May 2, 2016; Chinese Patent Application 201710237780.5, filed on Apr. 12, 2017, in the State Intellectual Property Office of the People's Republic of China (CN), the disclosure of which are incorporated herein by references in their entireties.

BACKGROUND

1. Technical Field of the Invention

The present invention relates to the field of integrated circuit, and more particularly to processors.

2. Prior Art

Conventional processors use logic-based computation (LBC), which carries out computation primarily with logic circuits (e.g. XOR circuit). Conventional logic circuits are suitable for arithmetic functions, whose operations include only basic arithmetic operations, i.e. the arithmetic operations performable by the conventional logic circuits per se. As is well known in the art, the basic arithmetic operations consist of addition, subtraction and multiplication. However, the conventional logic circuits are not suitable for non-arithmetic functions, whose operations include more than the basic arithmetic operations. Because they cannot be represented by a combination of the basic arithmetic operations, the non-arithmetic functions cannot be implemented by the conventional logic circuits alone. Exemplary non-arithmetic functions include transcendental functions and special functions. Non-arithmetic functions are computationally hard and their hardware implementation has been a major challenge.

For the conventional processors, only few basic non-arithmetic functions (e.g. basic algebraic functions and basic transcendental functions) are implemented by hardware and they are referred to as built-in functions. These built-in functions are realized by a combination of logic circuits and look-up tables (LUT). For example, U.S. Pat. No. 5,954,787 issued to Eun on Sep. 21, 1999 taught a method for generating sine/cosine functions using LUTs; U.S. Pat. No. 9,207,910 issued to Azadet et al. on Dec. 8, 2015 taught a method for calculating a power function using LUTs.

Realization of built-in functions is further illustrated in FIG. 1A. A conventional processor 300 generally comprises a logic circuit 380 and a memory circuit 370. The logic circuit 380 comprises an arithmetic logic unit (ALU) for performing arithmetic operations, while the memory circuit 370 stores an LUT for the built-in function. To obtain a desired precision, the built-in function is approximated to a polynomial of a sufficiently high order. The LUT 370 stores the coefficients of the polynomial; and the ALU 380 calculates the polynomial. Because the ALU 380 and the LUT 370 are formed side-by-side on a semiconductor substrate 0, this type of horizontal integration is referred to as two-dimensional (2-D) integration.

Computation has been developed along the directions of computational density and computational complexity. The computational density is a figure of merit for parallel computation and it refers to the computational power (e.g. the number of floating-point operations per second) per die area. The computational complexity is a figure of merit for scientific computation and it refers to the total number of built-in functions supported by a processor. The 2-D integration severely limits computational density and computational complexity.

For the 2-D integration, inclusion of the LUT 370 increases the die size of the conventional processor 300 and lowers its computational density. This has an adverse effect on parallel computation. Moreover, because the ALU 380 is the primary component of the conventional processor 300 and occupies a large die area, the LUT 370 is left with a small die area and only supports few built-in functions. FIG. 1B lists all built-in transcendental functions supported by an Intel Itanium (IA-64) processor (referring to Harrison et al. "The Computation of Transcendental Functions on the IA-64 Architecture", Intel Technical journal, Q4 1999, hereinafter Harrison). The IA-64 processor supports a total of 7 built-in transcendental functions, each using a relatively small LUT (from 0 to 24 kb) in conjunction with a relatively high-degree Taylor-series calculation (from 5 to 22).

This small set of built-in functions (~10 types, including arithmetic operations) is the foundation of scientific computation. Scientific computation uses advanced computing capabilities to advance human understandings and solve engineering problems. It has wide applications in computational mathematics, computational physics, computational chemistry, computational biology, computational engineering, computational economics, computational finance and other computational fields. The prevailing framework of scientific computation comprises three layers: a foundation layer, a function layer and a modeling layer. The foundation layer includes built-in functions that can be implemented by hardware. The function layer includes mathematical functions that cannot be implemented by hardware (e.g. non-basic non-arithmetic functions). The modeling layer includes mathematical models, which are the mathematical descriptions of the input-output characteristics of a system component.

The mathematical functions in the function layer and the mathematical models in the modeling layer are implemented by software. The function layer involves one software-decomposition step: mathematical functions are decomposed into combinations of built-in functions by software, before these built-in functions and the associated arithmetic operations are calculated by hardware. The modeling layer involves two software-decomposition steps: the mathematical models are first decomposed into combinations of mathematical functions; then the mathematical functions are further decomposed into combinations of built-in functions. Apparently, the software-implemented functions (e.g. mathematical functions, mathematical models) run much slower and less efficient than the hardware-implemented functions (i.e. built-in functions), and extra software-decomposition steps (e.g. for mathematical models) would make these performance gaps even more pronounced.

Because the arithmetic operations performable by the ALC consist of addition, subtraction and multiplication, the mathematical models that can be represented by the ALC alone are linear models only. Typical mathematical models are nonlinear and cannot be represented by a combination of these arithmetic operations. To illustrate how computationally intensive a mathematical model could be, FIGS. 2A-2B disclose a simple example—the simulation of an amplifier circuit 20. The amplifier circuit 20 comprises a transistor 24 and a resistor 22 (FIG. 2A). All transistor models (e.g. MOS3, BSIM3 V3.2, BSIM4 V3.0, PSP of FIG. 2B) model the transistor behaviors based on the small set of built-in functions provided by the conventional processor 300. Due to the limited choice of the built-in functions, calculating even a single current-voltage (I-V) point for the transistor 24 requires a large amount of computation (FIG. 2B). As an example, the BSIM4 V3.0 transistor model needs 222 additions, 286 multiplications, 85 divisions, 16 square-root operations, 24 exponential operations, and 19 logarithmic operations. This large amount of computation makes simulation extremely slow and inefficient.

Three-dimensional memory (3D-M) has a larger storage capacity than the conventional two-dimensional memory (2D-M). U.S. Pat. No. 5,835,396, issued to Zhang on Nov. 10, 1998, discloses a three-dimensional read-only memory (3D-ROM) comprising a plurality of memory levels vertically stacked on a semiconductor substrate. Because all of its address lines are horizontal, the 3D-ROM of Zhang is a horizontal 3D-M. On the other hand, U.S. Pat. No. 8,638,611, issued to Sim et al. on Jan. 28, 2014, discloses another 3D-M. It comprises a plurality of memory strings disposed on a semiconductor substrate. Each vertical string contains a plurality of vertically stacked memory cells. Because a set of its address lines are vertical, the 3D-M of Sim is a vertical 3D-M. Being monolithic, the memory cells of the 3D-M are not in contact with any semiconductor substrate and there is no semiconductor substrate between these memory cells.

Disposed above the semiconductor substrate, the memory cells of the 3D-M are made of semiconductor materials in polycrystalline or amorphous form, i.e. the memory cells of the 3D-M do not comprise any single-crystalline semiconductor material. On the other hand, the memory cells of the conventional 2D-M, disposed in the semiconductor substrate, are made of semiconductor materials in a single-crystalline form, i.e. the memory cells of the 2D-M comprise at least a single-crystalline semiconductor material. Because the non-single-crystalline (e.g. polycrystalline or amorphous) semiconductor materials are inferior in performance than the single-crystalline semiconductor materials, a 3D-M cell is generally slower in speed than a 2D-M cell. Accordingly, although it has a larger storage capacity, the 3D-M was considered not suitable for high-performance computation (HPC), e.g. as an embedded memory in a high-speed processor.

Objects and Advantages

It is a principle object of the present invention to provide a paradigm shift for scientific computation.

It is a further object of the present invention to reverse the general expectation that the three-dimension memory is not suitable for high-performance computation (HPC).

It is a further object of the present invention to provide a processor with improved computational complexity.

It is a further object of the present invention to provide a processor with a large set of built-in functions.

It is a further object of the present invention to realize non-arithmetic functions rapidly and efficiently.

It is a further object of the present invention to realize rapid and efficient modeling and simulation.

It is a further object of the present invention to provide a processor with improved computational density.

In accordance with these and other objects of the present invention, the present invention discloses a three-dimensional processor (3D-processor) for parallel computing.

SUMMARY OF THE INVENTION

The present invention discloses a three-dimensional processor (3D-processor) for parallel computing. It comprises a semiconductor substrate and an array of computing elements thereon. Each computing element comprises an arithmetic logic circuit (ALC) formed on the semiconductor substrate and at least a three-dimensional memory (3D-M) array stacked above the ALC. The 3D-M array stores at least a portion of a look-up table (LUT, or 3DM-LUT) for a mathematical function, while the ALC performs arithmetic operations on selected 3DM-LUT data. The mathematical function implemented by the computing element is a non-arithmetic function, which includes more operations than arithmetic operations performable by the ALC. The 3D-M array and the ALC are communicatively coupled through a plurality of inter-storage-processor (ISP) connections, e.g. contact vias.

The present invention further discloses a memory-based computation (MBC), which carries out computation primarily with the 3DM-LUT. Compared with the conventional logic-based computation (LBC), the 3DM-LUT used by the MBC has a much larger capacity than the conventional LUT. Although arithmetic operations are still performed for most MBCs, using a larger LUT as a starting point, the MBC only needs to calculate a polynomial to a smaller order. For the MBC, the fraction of computation done by the 3DM-LUT is significantly more than the ALC.

Because the 3D-M array is stacked above the ALC, this type of vertical integration is referred to as three-dimensional (3-D) integration. The 3-D integration has a profound effect on the computational density. Because the 3D-M array does not occupy any substrate area, the footprint of the computing element is roughly equal to that of the ALC. However, the footprint of a conventional processor is roughly equal to the sum of the footprints of the LUT and the ALU. By moving the LUT from aside to above, the computing element becomes smaller. The 3D-processor would contain more computing elements, become more computationally powerful and support massive parallelism. Preferably, a 3D-processor comprises at least one thousand computing elements, and in some cases, at least ten thousand computing elements. Although each individual 3D-M cell is slower than a 2D-M cell, this deficiency in speed can be offset by a significantly larger scale of parallelism. As a result, the 3D-processor becomes suitable for high-performance computation.

The 3-D integration also has a profound effect on the computational complexity. Because it supports the 3-D integration and has a much larger storage capacity than the conventional 2D-M, the 3D-M in the preferred 3D-processor has a total LUT capacity of at least one gigabit, and in some cases, at least ten gigabits, which is large enough to support a larger LUT for each mathematical functions and a significantly larger scale of parallelism. For example, since the total 3DM-LUT capacity for a single 3D-processor die could reach 100 Gb (for example, a 3D-XPoint die has a storage capacity of 128 Gb), a single 3D-processor die could support as many as ten thousand built-in functions, which are orders of magnitude more than the conventional processor.

Significantly more built-in functions shall flatten the prevailing framework of scientific computation (including the foundation, function and modeling layers). The hardware-implemented functions, which were only available to the foundation layer, now become available to the function and modeling layers. Not only mathematical functions in the function layer can be directly realized by hardware, but also mathematical models in the modeling layer can be directly described by hardware. In the function layer, mathematical functions can be realized by a function-by-LUT method, i.e. the function values are calculated by reading the 3DM-LUT plus polynomial interpolation. In the modeling layer, mathematical models can be described by a model-by-LUT method, i.e. the input-output characteristics of a system component are modeled by reading the 3DM-LUT plus polynomial interpolation. Rapid and efficient computation would lead to a paradigm shift for scientific computation.

Accordingly, the present invention discloses a three-dimensional processor (3D-processor) for parallel computing, comprising a single-crystalline semiconductor substrate and a plurality of computing elements including first and second computing elements disposed thereon, each of said computing elements comprising: at least a three-dimensional memory (3D-M) array including a plurality of vertically stacked memory cells for storing at least a portion of a look-up table (LUT) for a mathematical function, wherein said memory cells are neither in contact with nor interposed by any semiconductor substrate including said single-crystalline semiconductor substrate; and, said memory cells do not comprise any single-crystalline semiconductor material; an arithmetic logic circuit (ALC) disposed on said single-crystalline semiconductor substrate, wherein said ALC performs at least one arithmetic operation on selected data from said LUT; and, transistors in said ALC comprise at least a single-crystalline semiconductor material; a plurality of inter-storage-processor (ISP) connections entirely disposed between said 3D-M array and said single-crystalline semiconductor substrate for communicatively coupling said memory cells and said single-crystalline semiconductor substrate, wherein said ISP-connections do not penetrate through any semiconductor substrate including said single-crystalline semiconductor substrate; wherein said first and second computing elements calculate the values of respective mathematical function in parallel.

The present invention further discloses a 3D-processor for parallel computing, comprising a single-crystalline semiconductor substrate and a plurality of computing elements including first and second computing elements disposed thereon, each of said computing elements comprising: at least a three-dimensional vertical memory (3D-$M_V$) array including a plurality of vertically stacked memory cells for storing at least a portion of a look-up table (LUT) for a mathematical function, wherein said memory cells are neither in contact with nor interposed by any semiconductor substrate including said single-crystalline semiconductor substrate; and, said memory cells do not comprise any single-crystalline semiconductor material; an arithmetic logic circuit (ALC) disposed on said single-crystalline semiconductor substrate, wherein said ALC performs at least one arithmetic operation on selected data from said LUT; and, transistors in said ALC comprise at least a single-crystalline semiconductor material; a plurality of inter-storage-processor (ISP) connections entirely disposed between said 3D-$M_V$ array and said single-crystalline semiconductor substrate for communicatively coupling said memory cells and said single-crystalline semiconductor substrate, wherein said ISP-connections do not penetrate through any semiconductor substrate including said single-crystalline semiconductor substrate; wherein said first and second computing elements calculate the values of respective mathematical function in parallel.

BRIEF DESCRIPTION OF THE DRAWINGS

FIG. 1A is a schematic view of a conventional processor (prior art); FIG. 1B lists all transcendental functions supported by an Intel Itanium (IA-64) processor (prior art);

FIG. 2A is a circuit block diagram of an amplifier circuit; FIG. 2B lists number of operations to calculate a current-voltage (I-V) point for various transistor models (prior art);

Figure 3A:
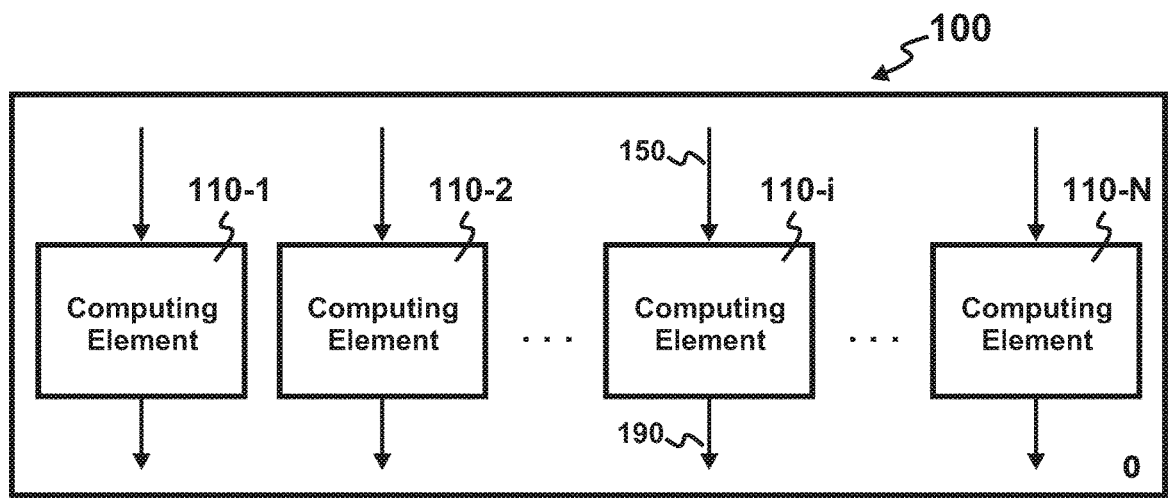
FIG. 3A is a block diagram of a preferred 3D-processor.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

Throughout this specification, the phrase "mathematical functions" refer to non-arithmetic functions only, it could also refer to mathematical models; the phrase "memory" is used in its broadest sense to mean any semiconductor-based holding place for information, either permanent or temporary; the phrase "permanent" is used in its broadest sense to mean any long-term storage; the phrase "communicatively coupled" is used in its broadest sense to mean any coupling whereby information may be passed from one element to another element; the phrase "on the substrate" means the active elements of a circuit (e.g. transistors) are formed on the surface of the substrate, although the interconnects between these active elements are formed above the substrate and do not touch the substrate; the phrase "above the substrate" means the active elements (e.g. memory cells) are formed above the substrate and do not touch the substrate; the term "3DM-LUT" refers to the look-up table (LUT) stored in the three-dimensional memory (3D-M) array(s), or the physical LUT circuit in the form of the 3D-M array(s); the symbol "/" means a relationship of "and" or "or".

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 3B:
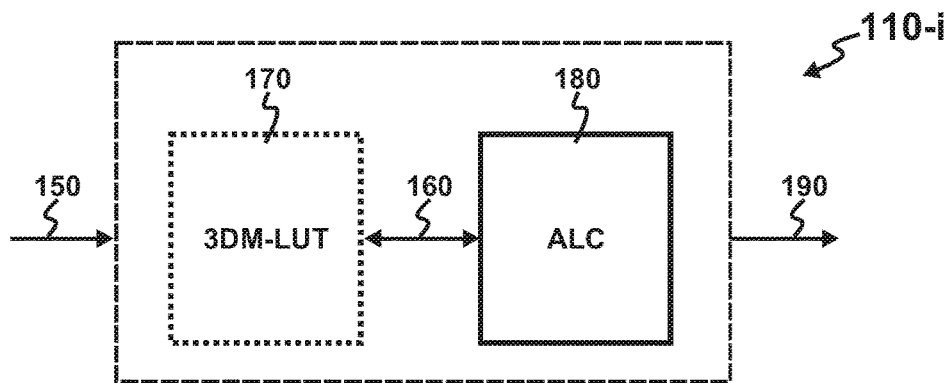
FIG. 3B is a block diagram of a preferred computing element.

Referring now to FIG. 3A-3B, a preferred three-dimensional processor (3D-processor) 100 is disclosed. It comprises a semiconductor substrate 0 and an array of computing elements 110-1, 110-2 . . . 110-$i$ . . . 110-N formed thereon (FIG. 3A). These computing elements 110-1 . . . 110-N could realize a same function or different functions. Each computing element 110-$i$ has one or more input variables 150, and one or more output variables 190 (FIG. 3B). It further comprises at least a three-dimensional memory (3D-M) array 170 for storing at least a portion of the 3DM-LUT for a mathematical function and an arithmetic logic circuit (ALC) 180 for performing arithmetic operations on selected 3DM-LUT data. The mathematical function implemented by the computing element 110-$i$ is a non-arithmetic function, which includes more operations than arithmetic operations performable by the ALC 180. The ALC 180 and the 3D-M array 170 are communicatively coupled by inter-storage-processor (ISP) connections 160. Examples of the ISP connections 160 include contact vias between the 3D-M array 170 and the ALC 180. Formed on a different physical level than the ALC 180, the 3D-M array 170 is represented by dotted line in all figures.

The 3D-processor 100 uses memory-based computation (MBC), which carries out computation primarily with the 3DM-LUT 170. Compared with the conventional logic-based computation (LBC), the 3DM-LUT 170 used by the MBC has a much larger capacity than the conventional LUT 370. Although arithmetic operations are still performed for most MBCs, using a larger LUT as a starting point, the MBC only needs to calculate a polynomial to a smaller order. For the MBC, the fraction of computation done by the 3DM-LUT 170 could be more than the ALC 180.

Figures 4A, 4B, 4C:
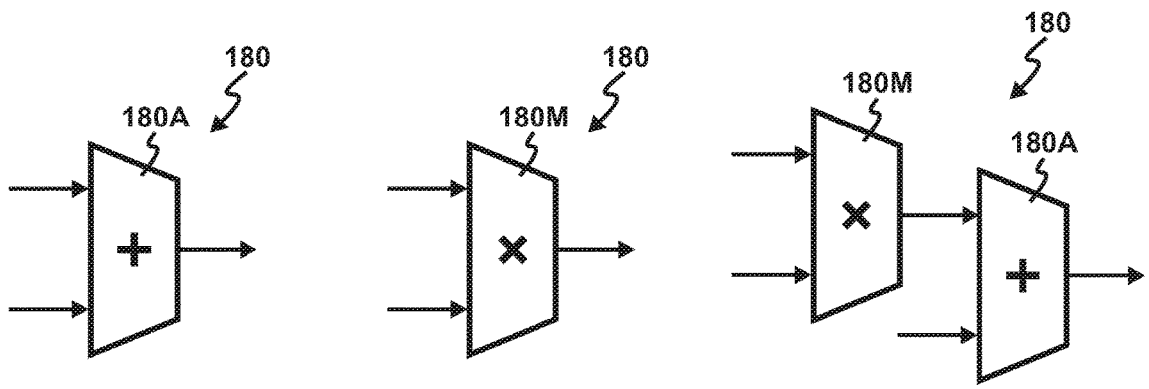
FIGS. 4A-4C are the block diagrams of three preferred ALC.

FIGS. 4A-4C are the block diagrams of three preferred ALC 180. The first preferred ALC 180 comprises an adder 180A, the second preferred ALC 180 comprises a multiplier 180M, with the third preferred ALC 180 comprising a multiply-accumulator (MAC), which includes an adder 180A and a multiplier 180M. The preferred ALC 180 could perform integer arithmetic operations, fixed-point arithmetic operations, or floating-point arithmetic operations.

Referring now to FIGS. 5A-5D, four preferred computing elements 110-1 comprising different 3D-M arrays 170 are disclosed. Since the ALC 180 of the preferred computing element 110-1 is formed on a single-crystalline semiconductor substrate 0, transistors in the ALC 180 comprises at least a single-crystalline semiconductor material. On the other hand, each 3D-M array 170 comprises a plurality of vertically stacked memory cells. Because they are not in contact with any semiconductor substrate and there is no semiconductor substrate between memory cells, memory cells do not comprise any single-crystalline semiconductor material. Note that the ALC 180 is formed on a top surface of the single-crystalline semiconductor substrate 0, while the 3D-M array 170 is formed above the top surface of the single-crystalline semiconductor substrate 0.

3D-M can be categorized into 3D-RAM (random access memory) and 3D-ROM (read-only memory). As used herein, the phrase "RAM" is used in its broadest sense to mean any memory which holds information temporarily. Exemplary RAM includes SRAM and DRAM; the phrase "ROM" is used in its broadest sense to mean any memory which holds information for a long time, even when power goes off. ROM is also referred to as non-volatile memory (NVM). The 3D-ROM is further categorized into 3-D writable memory (3D-W) and 3-D printed memory (3D-P).

For 3D-W, data can be electrically written (or, programmable). Based on the number of programmings allowed, a 3D-W can be categorized into three-dimensional one-time-programmable memory (3D-OTP) and three-dimensional multiple-time-programmable memory (3D-MTP). The 3D-OTP can be written once, while the 3D-MTP is electrically re-programmable. 3D-MTP include memristor, resistive random-access memory (RRAM or ReRAM), phase-change memory, programmable metallization cell (PMC), conductive-bridging random-access memory (CBRAM), and the like. For 3D-W, the 3DM-LUT 170 can be configured in the field. This becomes even better for 3D-MTP, as the 3DM-LUT 170 would become re-configured.

For 3D-P, data are recorded thereto using a printing method during manufacturing. These data are fixedly recorded and cannot be changed after manufacturing. The printing methods include photo-lithography, nano-imprint, e-beam lithography, DUV lithography, and laser-programming, etc. An exemplary 3D-P is three-dimensional mask-programmed read-only memory (3D-MPROM), whose data are recorded by photo-lithography. Because electrical programming is not required, a memory cell in the 3D-P can be biased at a larger voltage during read than the 3D-W and therefore, the 3D-P is faster than the 3D-W.

Based on its physical structure, the 3D-M can be categorized into horizontal 3D-M (3D-$M_H$) and vertical 3D-M (3D-$M_V$). In a 3D-$M_H$, all address lines are horizontal. The memory cells form a plurality of horizontal memory levels which are vertically stacked above each other. A well-known 3D-$M_H$ is 3D-XPoint. In a 3D-$M_V$, at least one set of address lines are vertical. The memory cells form a plurality of vertical memory strings which are placed side-by-side on/above the substrate. A well-known 3D-$M_V$ is 3D-NAND. In general, the 3D-$M_H$ (e.g. 3D-XPoint) is faster, while the 3D-$M_V$ (e.g. 3D-NAND) is denser.

Figure 5A:
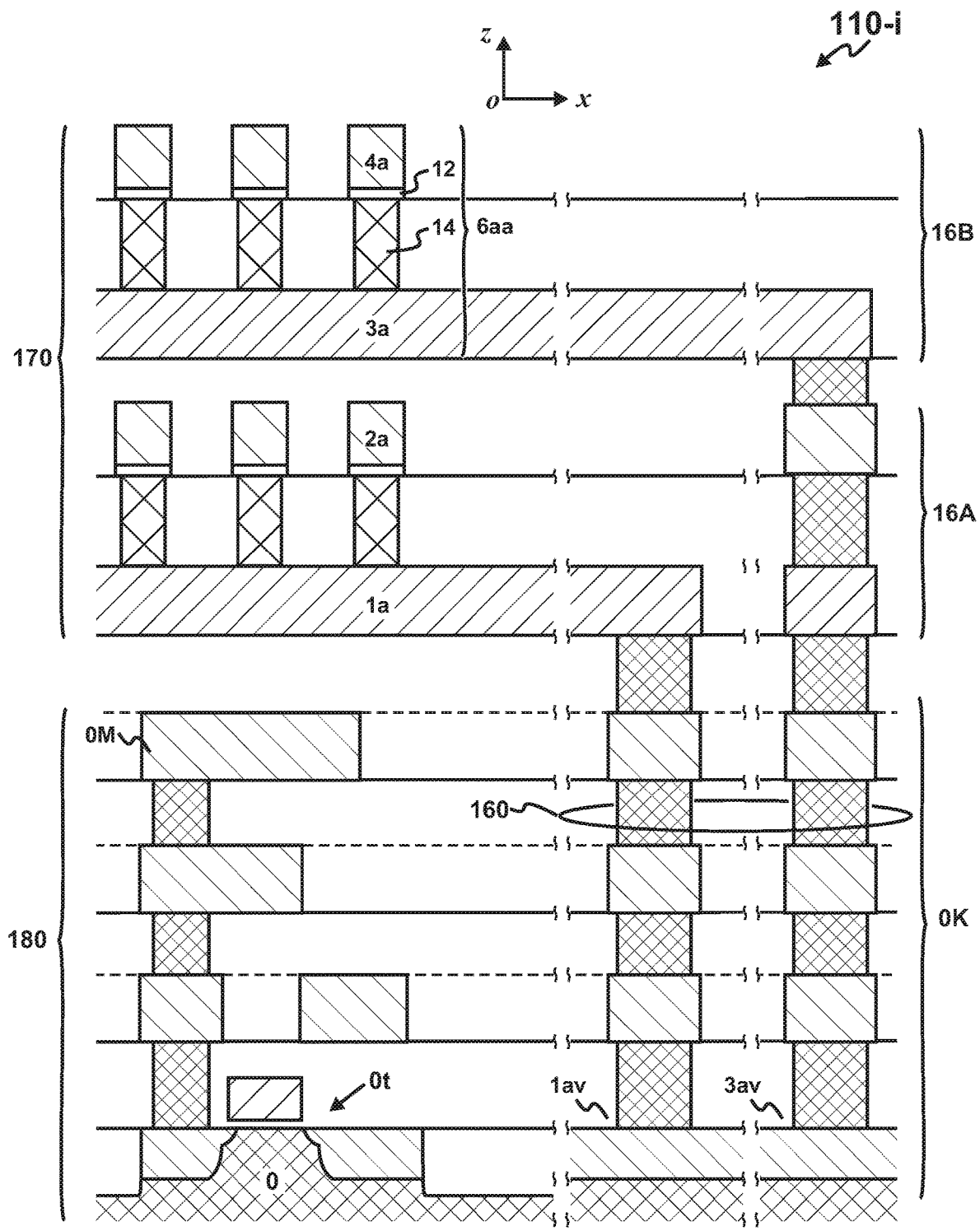
FIGS. 5A-5D are cross-sectional views of the preferred computing elements comprising four different 3D-M arrays.

FIG. 5A discloses a preferred computing element 110-$i$ comprising at least a 3D-W array 170. It comprises a substrate circuit 0K formed on the substrate 0. The ALC 180 is a portion of the substrate circuit 0K. The 3D-W array 170 is a 3D-$M_H$ array including two memory levels 16A, 16B, with a first memory level 16A stacked above the substrate circuit 0K and a second memory level 16B stacked above the first memory level 16A. The substrate circuit 0K includes the peripheral circuits of the memory levels 16A, 16B. It comprises transistors 0$t$ and the associated interconnect 0M. Each of the memory levels (e.g. 16A, 16B) comprises a plurality of first address lines (i.e. y-lines, e.g. 2$a$, 4$a$), a plurality of second address lines (i.e. x-lines, e.g. 1$a$, 3$a$) and a plurality of 3D-W cells (e.g. 6$aa$). The first and second memory levels 16A, 168 are coupled to the ALC 180 through contact vias 1$av$, 3$av$, respectively. The LUTs stored in all 3D-M arrays coupled to the ALC 180 are collectively referred to as the 3DM-LUT 170. Coupling the 3DM-LUT 170 with the ALC 180, the contact vias 1$av$, 3$av$ are collectively referred to as IPS-connections 160.

The 3D-W cell 5$aa$ comprises a programmable layer 12 and a diode layer 14. The programmable layer 12 could be an OTP layer (e.g. an antifuse layer, which can be programmed once and is used for the 3D-OTP) or a re-programmable layer (e.g. an RRAM layer, which can be programmed multiple times and is used for the 3D-MTP). The diode layer 14 is broadly interpreted as any layer whose resistance at the read voltage is substantially lower than when the applied voltage has a magnitude smaller than or polarity opposite to that of the read voltage. The diode could be a semiconductor diode (e.g. p-i-n silicon diode), or a metal-oxide (e.g. $TiO_2$) diode.

Figure 5B:
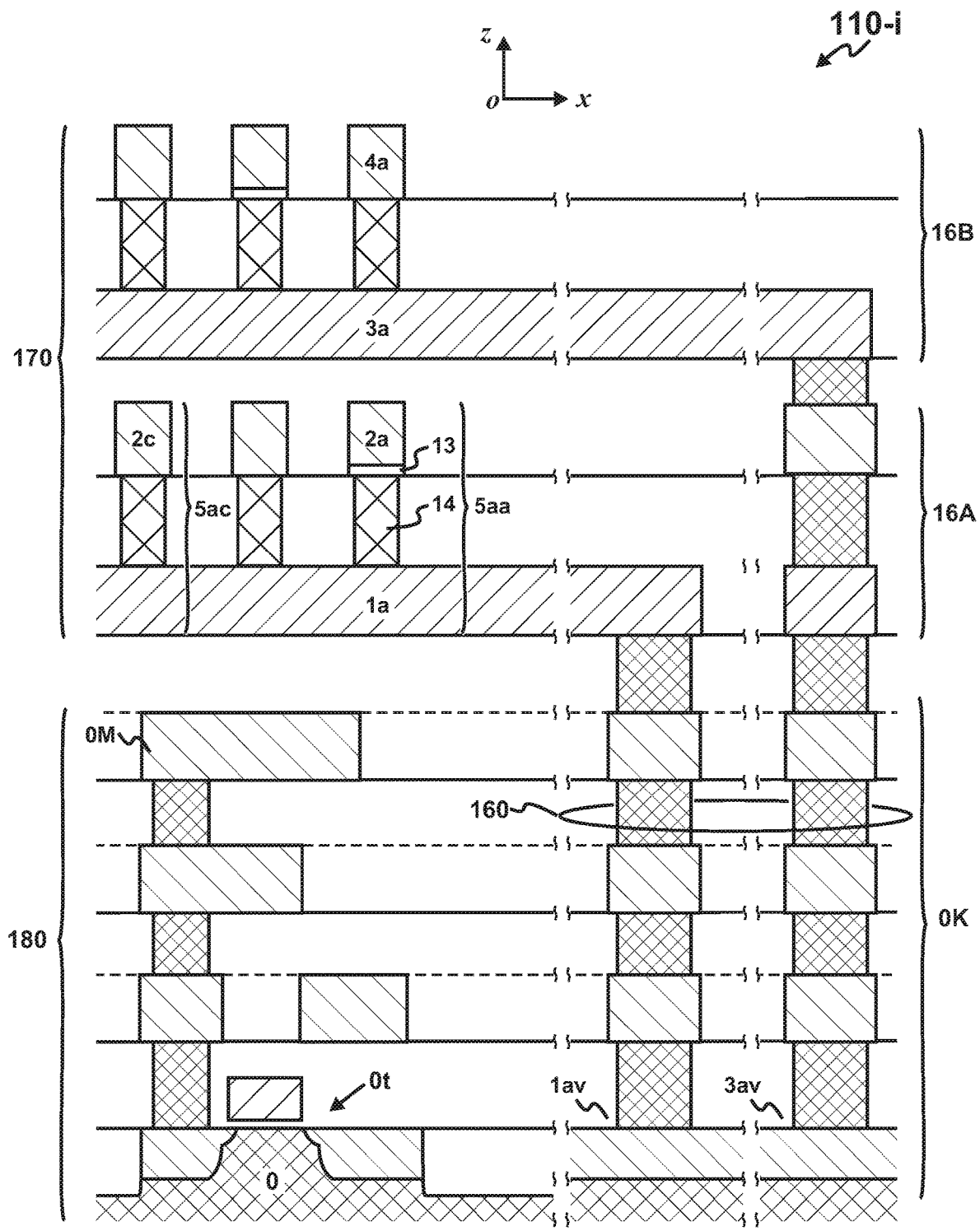

FIG. 5B discloses a preferred computing element 110-*i* comprising at least a 3D-P array 170. It has a structure similar to that of FIG. 5A except for the memory cells. 3D-P has at least two types of memory cells: a high-resistance 3D-P cell 5*aa*, and a low-resistance 3D-P cell 5*ac*. The low-resistance 3D-P cell 5*ac* comprises a diode layer 14, while the high-resistance 3D-P cell 5*aa* comprises at least a high-resistance layer 13. The diode layer 14 is similar to that in the 3D-W. The high-resistance layer 13, on the other hand, could simply be a layer of insulating dielectric (e.g. silicon oxide, or silicon nitride). It is physically removed at the location of the low-resistance 3D-P cell 5*ac* during manufacturing.

Figure 5C:
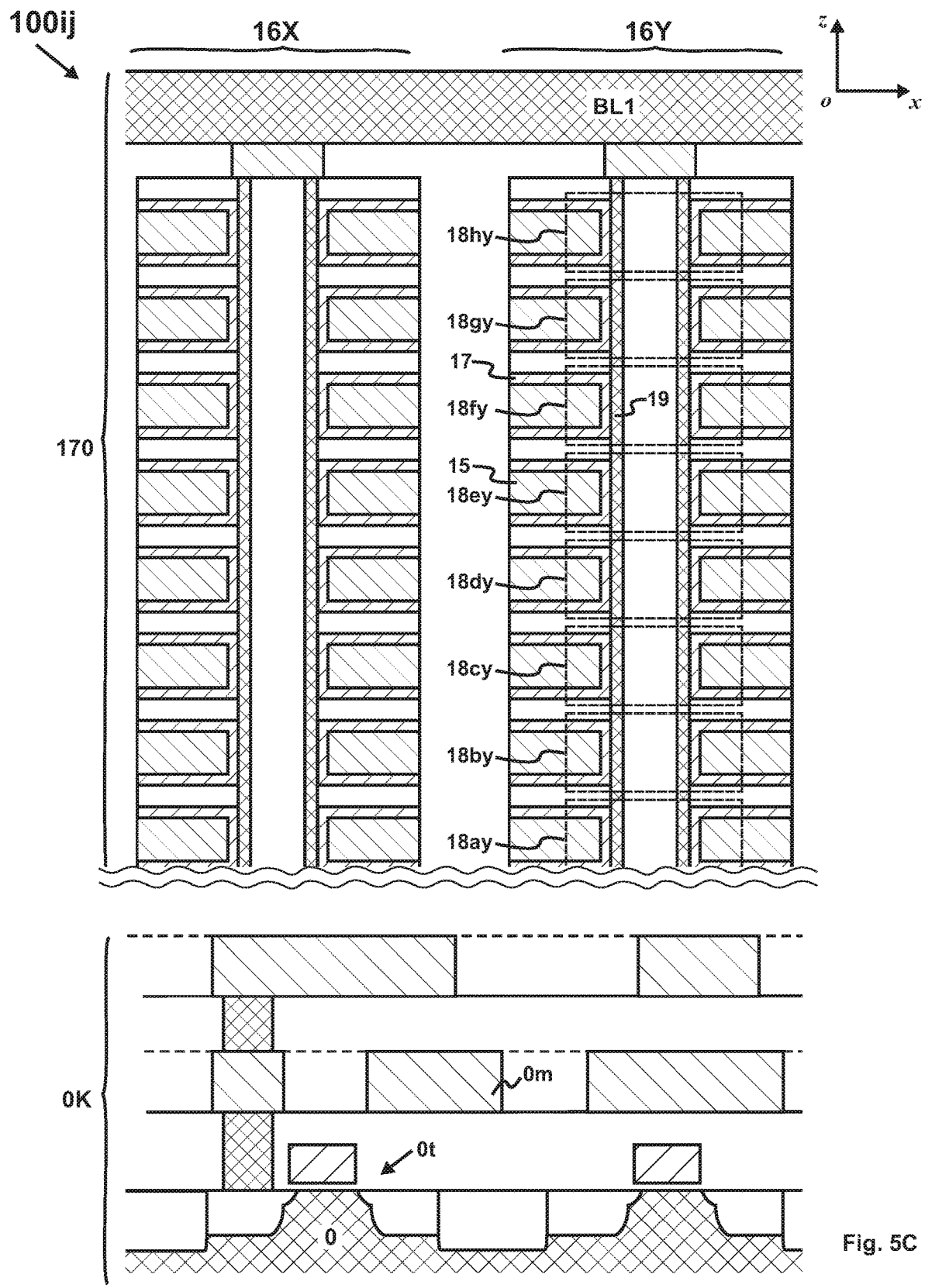
Figure 5D:
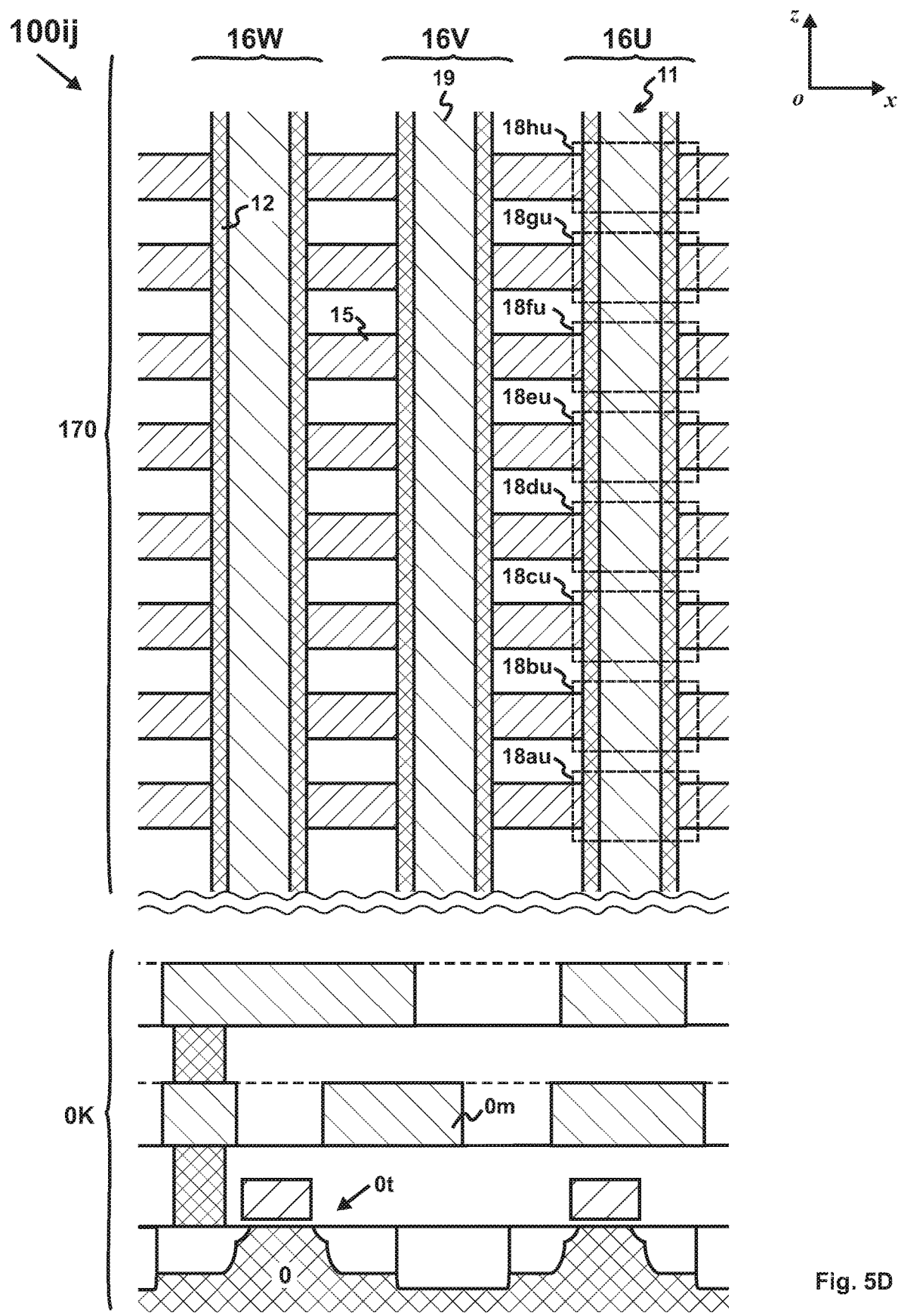

In FIGS. 5C-5D, the preferred configurable processor 100 comprises a substrate circuit 0K and a plurality of 3D-$M_V$ arrays 170 vertically stacked thereon. The substrate circuit 0K is similar to those in FIG. 5A. The 3D-$M_V$ array 170 comprises a plurality of vertically stacked horizontal address lines 15. The 3D-$M_V$ array 170 also comprises a set of vertical address lines, which are perpendicular to the surface of the substrate 0. The 3D-$M_V$ has the largest storage density among semiconductor memories. For reason of simplicity, the ISP-connections (e.g. contact vias) 160 between the 3D-$M_V$ arrays 170 and the substrate circuit 0K are not shown. They are similar to those in the 3D-$M_H$ arrays 170 of FIG. 5A and well known to those skilled in the art.

The preferred 3D-$M_V$ array 170 in FIG. 5C is based on transistors or transistor-like devices. It comprises a plurality of vertical memory strings 16X, 16Y placed side-by-side. Each memory string (e.g. 16Y) comprises a plurality of vertically stacked memory cells (e.g. 18*ay*-18*hy*). Each memory cell (e.g. 18*fy*) comprises a vertical transistor, which includes a gate (acts as a horizontal address line) 15, a storage layer 17, and a vertical channel (acts as a vertical address line) 19. The storage layer 17 could comprise oxide-nitride-oxide layers, oxide-poly silicon-oxide layers, or the like. This preferred 3D-$M_V$ array 170 is a 3D-NAND and its manufacturing details are well known to those skilled in the art.

The preferred 3D-$M_V$ array 170 in FIG. 5D is based on diodes or diode-like devices. In this preferred embodiment, the 3D-$M_V$ array comprises a plurality of vertical memory strings 16U-16W placed side-by-side. Each memory string (e.g. 16U) comprises a plurality of vertically stacked memory cells (e.g. 18*au*-18*hu*). The 3D-$M_V$ array 170 comprises a plurality of horizontal address lines (e.g. word lines) 15 which are vertically stacked above each other. After etching through the horizontal address lines 15 to form a plurality of vertical memory wells 11, the sidewalls of the memory wells 11 are covered with a programmable layer 12. The memory wells 11 are then filled with a conductive materials to form vertical address lines (e.g. bit lines) 19. The conductive materials could comprise metallic materials or doped semiconductor materials. The memory cells 18*au*-18*hu* are formed at the intersections of the word lines 15 and the bit line 19. Similar to that in FIG. 5A, the programmable layer 12 could be one-time-programmable (OTP, e.g. an antifuse layer) or multiple-time-programmable (MTP, e.g. an RRAM layer).

To minimize interference between memory cells, a diode or a diode-like device is preferably formed between the word line 15 and the bit line 19. In a first preferred embodiment, the programmable layer 12 acts as a diode. In a second preferred embodiment, this diode is formed by depositing an extra diode layer on the sidewall of the memory well (not shown in this figure). In a third preferred embodiment, this diode is formed naturally between the word line 15 and the bit line 19, i.e. to form a built-in junction (e.g. P-N junction, or Schottky junction). More details on the built-in diode are disclosed in U.S. patent application Ser. No. 16/137,512, filed on Sep. 20, 2018.

Figure 5E:
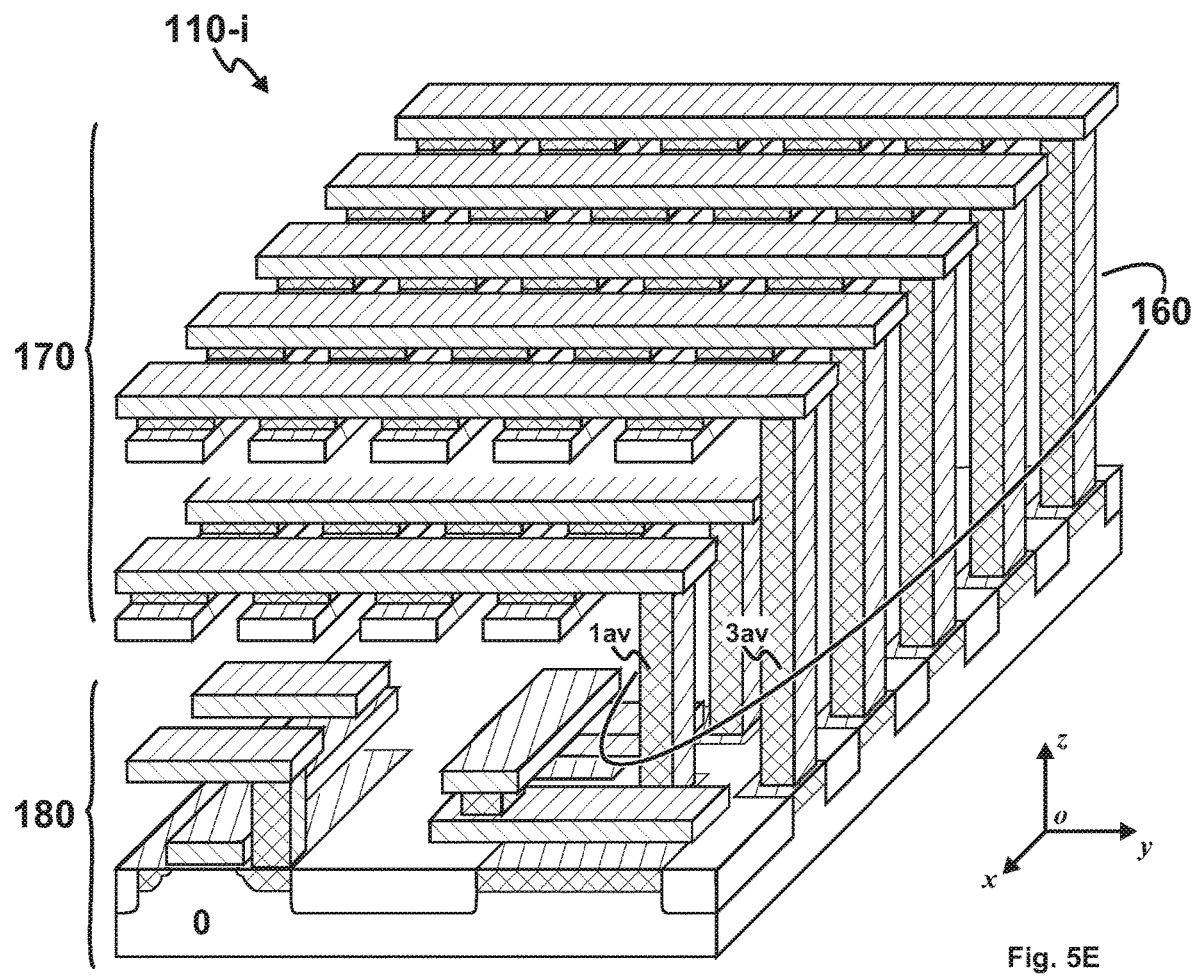
FIG. 5E is a perspective view of a preferred computing element.

FIG. 5E is a perspective view of the preferred computing element 110-*i*. The ALC 180 is formed on the substrate 0. The 3DM-LUT 170 is vertically stacked above and at least partially covers the ALC 180. The 3-D integration moves the 3DM-LUT 170 physically close to the ALC 180. Because the contact vias 1*av*, 3*av* coupling them are short (i.e. their length are on the order of microns) and numerous (thousands), the IPS-connections 160 have a much larger bandwidth than the conventional processor 300. As the 2-D integration places the ALU 380 and the LUT 370 side-by-side on the substrate 0, the interconnects coupling them are much longer (hundreds of ums in length) and fewer (hundreds at most).

Figure 6A:
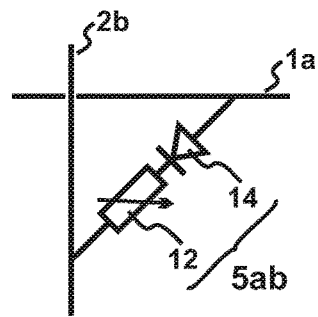
FIG. 6A is a schematic view of a 3D-M cell comprising a diode or a diode-like device.
Figure 6B:
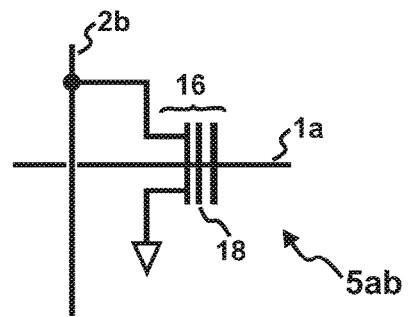
FIG. 6B is a schematic view of a 3D-M cell comprising a transistor or a transistor-like device.

FIGS. 6A-6B show two types of the preferred 3D-M cell 5*ab*. In the preferred embodiment of FIG. 6A, the 3D-M cell 5*ab* comprises a variable resistor 12 and a diode (or a diode-like device) 14. The variable resistor 12 is realized by the programmable layer of FIG. 5A. It can be varied during manufacturing or after manufacturing. The diode (or diode-like device) 14 is realized by the diode layer of FIG. 5A. It is broadly interpreted as any two-terminal device whose resistance at the read voltage is substantially lower than when the applied voltage has a magnitude smaller than or polarity opposite to that of the read voltage.

In the preferred embodiment of FIG. 6B, the 3D-M cell 5*ab* comprises a transistor or a transistor-like device 16. The transistor or transistor-like device 16 is broadly interpreted as any three- (or, more-) terminal device whose resistance between the first and second terminals can be modulated by an electrical signal on a third terminal. In this preferred embodiment, the device 16 further comprises a floating gate 18 for storing electrical charge which represents the digital information stored in the 3D-M cell 5*ab*. To those skilled in the art, the devices 16 can be organized into NOR-arrays or NAND-arrays. Depending on the direction of the current flow between the first and second terminals in the devices 16, the 3D-M could be categorized into horizontal 3D-M (e.g. 3D-XPoint) and vertical 3D-M (e.g. 3D-NAND).

Figure 7A:
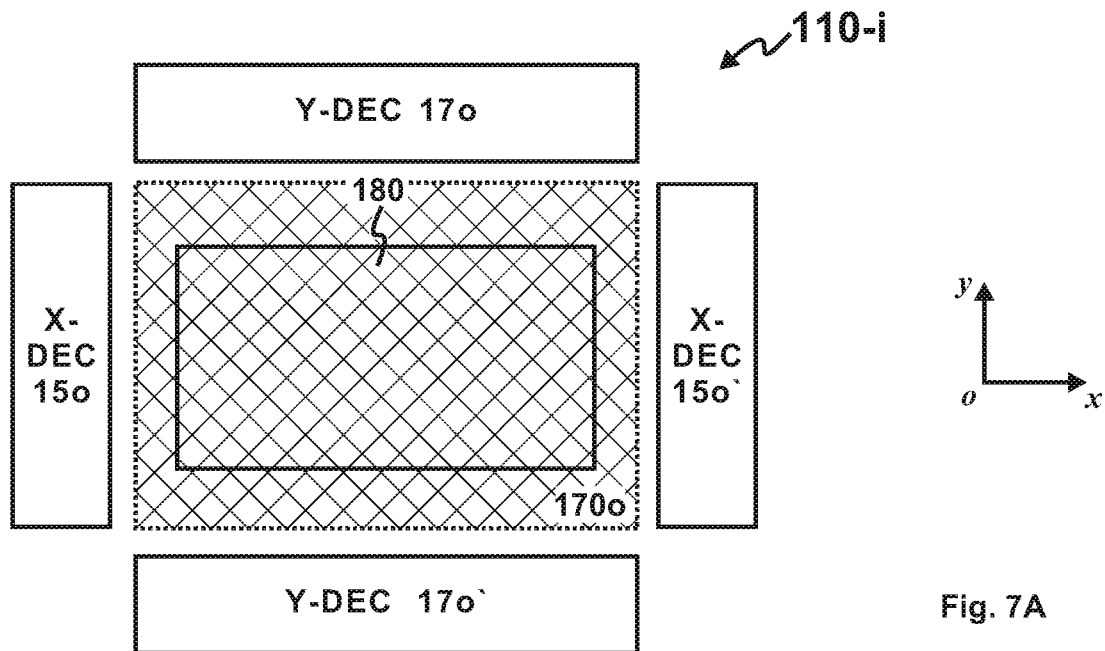
FIGS. 7A-7C are the substrate layout views of three preferred 3D-processors.
Figure 7B:
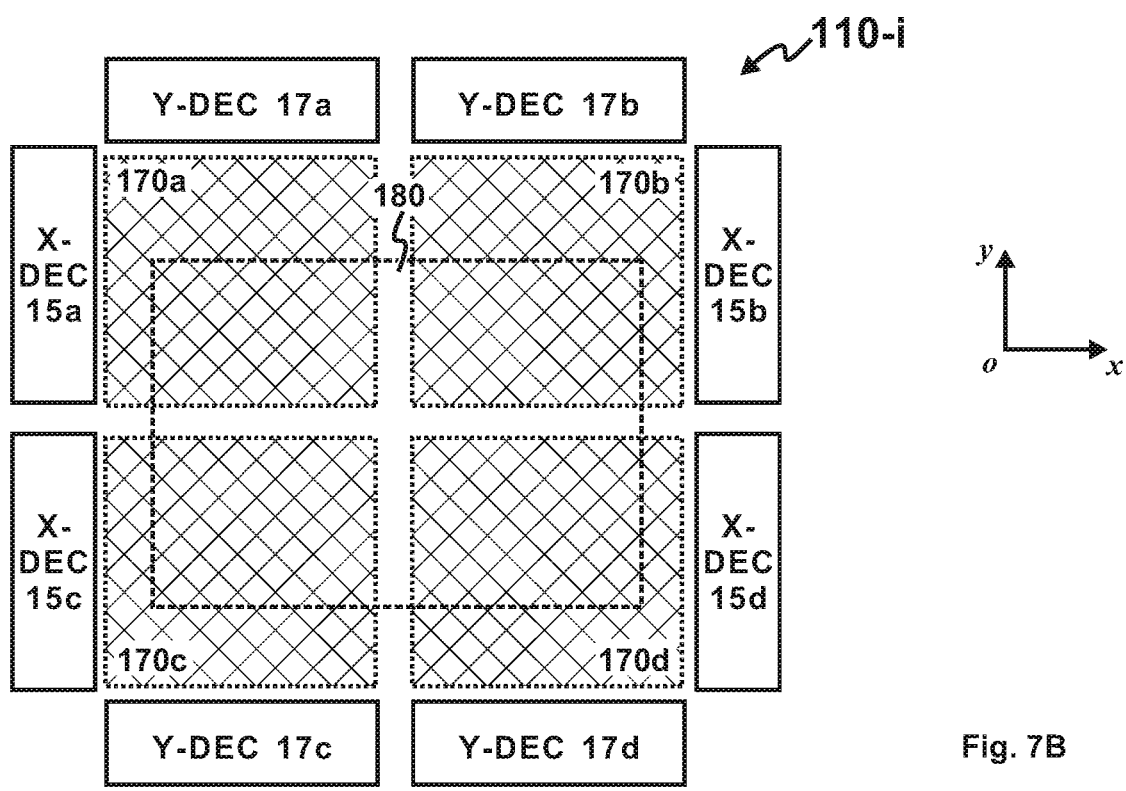
Figure 7C:
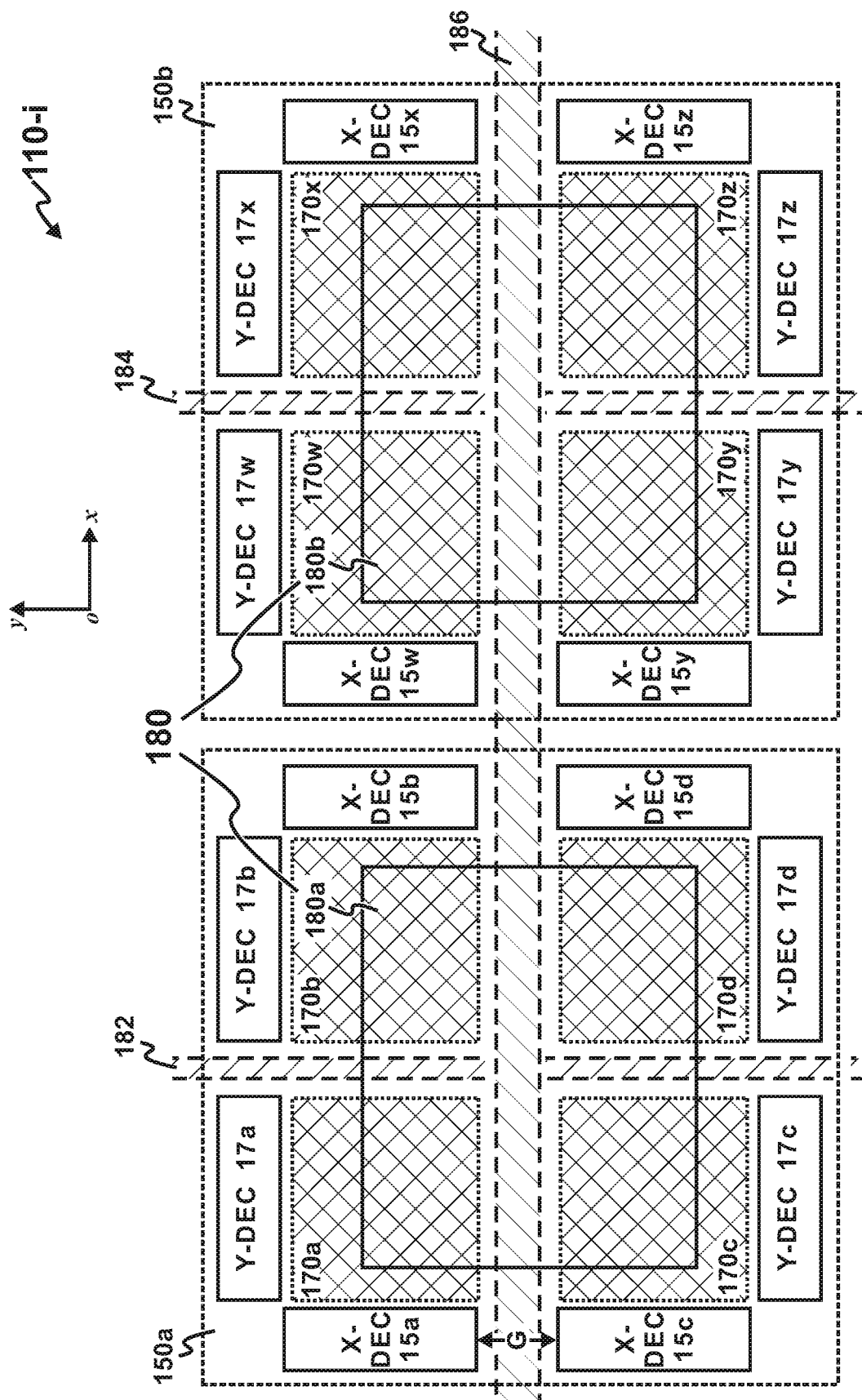

Referring now to FIGS. 7A-7C, the substrate layout views of three preferred computing elements 110-*i* are shown. In the embodiment of FIG. 7A, the ALC 180 is only coupled with a single 3D-M array 170*o* and processes the 3DM-LUT data therefrom. The 3DM-LUT 170 is stored in the 3D-M array 170*o*. The ALC 180 is covered by the 3D-M array 170. The 3D-M array 170*o* has four peripheral circuits, including X-decoders 15*o*, 15*o*' and Y-decoders 17*o*, 17*o*'. The ALC 180 is bound by these four peripheral circuits. As the 3D-M array is stacked above the substrate circuit 0K and does not occupy any substrate area, its projection on the substrate 0 is shown by dotted lines in this and following figures.

In the embodiment of FIG. 7B, the ALC 180 is coupled with four 3D-M arrays 170*a*-170*d* and processes the 3DM-LUT data therefrom. The 3DM-LUT 170 is stored in four 3D-M arrays 170*a*-170*d*. Different from FIG. 7A, each 3D-M array (e.g. 170*a*) has two peripheral circuits (e.g.

X-decoder 15a and Y-decoder 17a). The ALC 180 is bound by eight peripheral circuits (including X-decoders 15a-15d and Y-decoders 17a-17d) and located below four 3D-M arrays 170a-170d. Apparently, the ALC 180 of FIG. 7B could be four times as large as that of FIG. 7A.

In the embodiment of FIG. 7C, the ALC 180 is coupled with eight 3D-M arrays 170a-170d, 170w-170z and processes the 3DM-LUT data therefrom. The 3DM-LUT 170 is stored in eight 3D-M arrays 170a-170d, 170w-170z. These 3D-M arrays are divided into two sets: a first set 150a includes four 3D-M arrays 170a-170d, and a second set 150b includes four 3D-M arrays 170w-170z. Below the four 3D-M arrays 170a-170d of the first set 150a, a first component 180a of the ALC 180 is formed. Similarly, below the four 3D-M array 170w-170z of the second set 150b, a second component 180b of the ALC 180 is formed. In this embodiment, adjacent peripheral circuits (e.g. adjacent x-decoders 15a, 15c, or, adjacent y-decoders 17a, 17b) are separated by physical gaps G. These physical gaps allow the formation of the routing channel 182, 184, 186, which provide coupling between different components 180a, 180b, or between different ALCs 180a, 180b. Apparently, the ALC 180 of FIG. 7C could be eight times as large as that of FIG. 7A.

Because the 3D-M array 170 is stacked above the ALC 180, this type of vertical integration is referred to as 3-D integration. The 3-D integration has a profound effect on the computational density of the 3D-processor 100. Because the 3D-M array 170 does not occupy any substrate area 0, the footprint of the computing element 110-$i$ is roughly equal to that of the ALC 180. This is much smaller than a conventional processor 300, whose footprint is roughly equal to the sum of the footprints of the LUT 370 and the ALC 380. By moving the LUT from aside to above, the computing element becomes smaller. The 3D-processor 100 would contain more computing elements 110-1, become more computationally powerful and support massive parallelism. Preferably, a 3D-processor comprises at least one thousand computing elements, and in some cases, at least ten thousand computing elements. Although each individual 3D-M cell is slower than a 2D-M cell, this deficiency in speed can be offset by a significantly larger scale of parallelism. As a result, the 3D-processor becomes suitable for high-performance computation.

The 3-D integration also has a profound effect on the computational complexity. Because it supports the 3-D integration and has a much larger storage capacity than the conventional 2D-M, the 3D-M in the preferred 3D-processor 100 has a total LUT capacity of at least one gigabit, and in some cases, at least ten gigabits, which is large enough to support a larger LUT for each mathematical functions and a significantly larger scale of parallelism. For example, since the total 3DM-LUT capacity for a single 3D-processor die 100 could reach 100 Gb (for example, a 3D-XPoint die has a storage capacity of 128 Gb), a single 3D-processor die 100 could support as many as ten thousand built-in functions, which are orders of magnitude more than the conventional processor 300.

Significantly more built-in functions shall flatten the prevailing framework of scientific computation (including the foundation, function and modeling layers). The hardware-implemented built-in functions, which were only available to the foundation layer, now become available to the function and modeling layers. Not only mathematical functions in the function layer can be directly realized by hardware (FIGS. 8A-9B), but also mathematical models in the modeling layer can be directly described by hardware (FIGS. 10A-10B). In the function layer, mathematical functions can be realized by a function-by-LUT method, i.e. the function values are calculated by reading the 3DM-LUT data plus polynomial interpolation. In the modeling layer, mathematical models can be described by a model-by-LUT method, i.e. the input-output characteristics of a system component are modeled by reading the 3DM-LUT data plus polynomial interpolation. Rapid and efficient computation would lead to a paradigm shift for scientific computation.

Figure 8A:
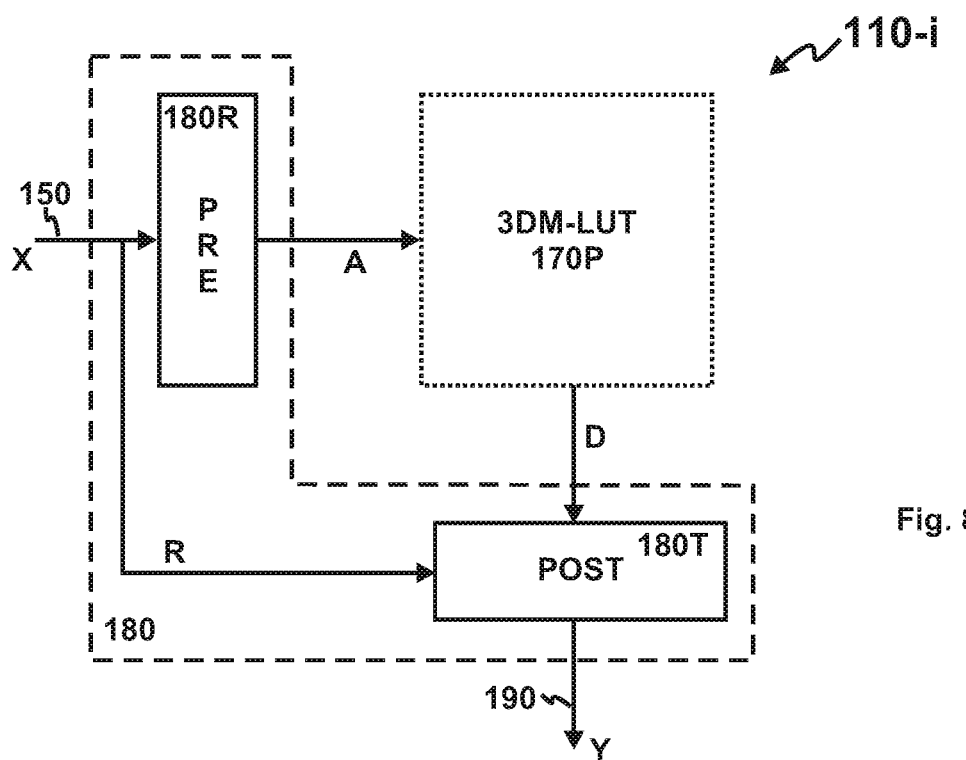
FIG. 8A is a block diagram of a first preferred computing element.
Figure 8B:
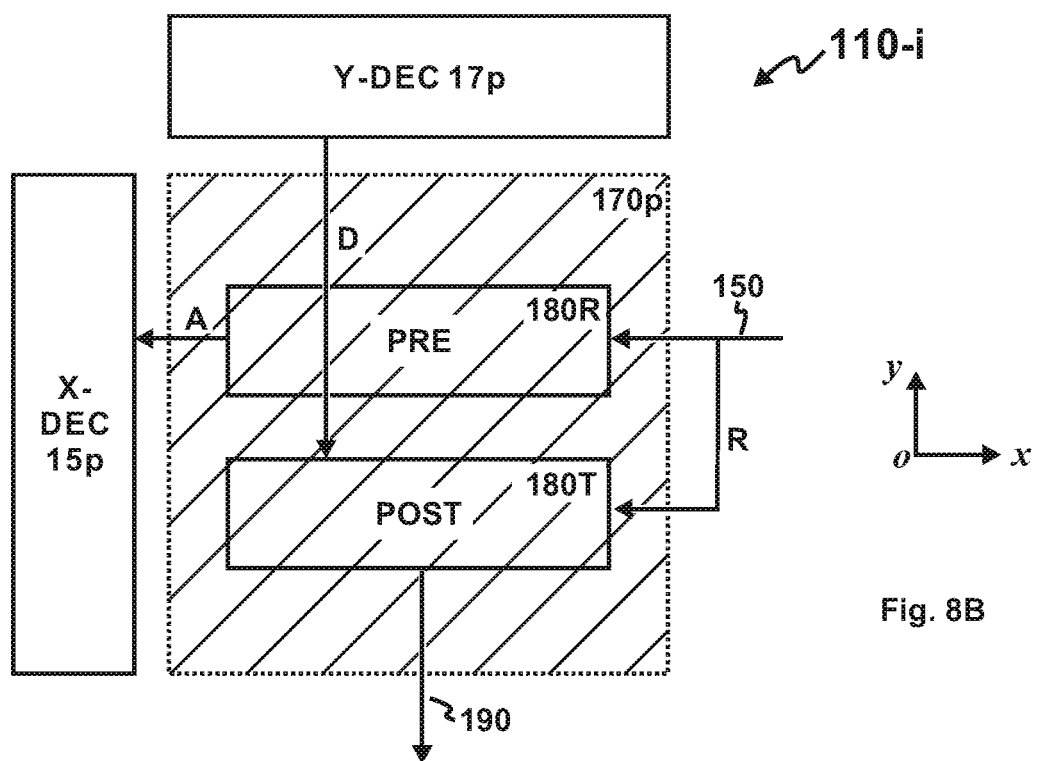
FIG. 8B is its substrate layout view.
Figure 8C:
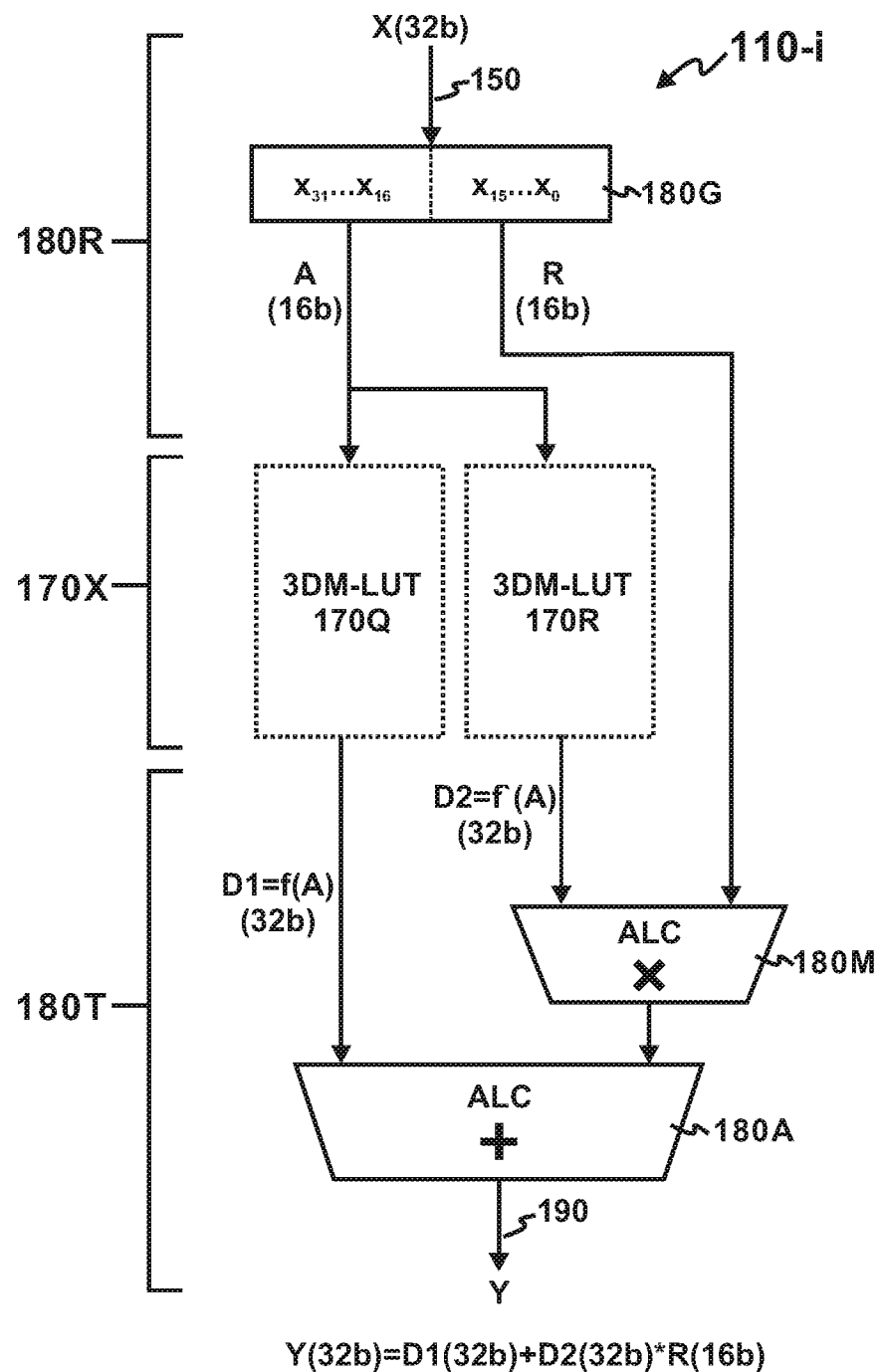
FIG. 8C is a detailed circuit diagram of the first preferred computing element.

Referring now to FIGS. 8A-8C, a first preferred computing element 110-$i$ implementing a built-in function Y=f(X) is disclosed. It uses the function-by-LUT method. FIG. 8A is its circuit block diagram. The ALC 180 comprises a pre-processing circuit 180R, a 3DM-LUT 170P, and a post-processing circuit 180T. The pre-processing circuit 180R converts the input variable (X) 150 into an address (A) of the 3DM-LUT 170P. After the data (D) at the address (A) is read out from the 3DM-LUT 170P, the post-processing circuit 180T converts it into the function value (Y) 190. A residue (R) of the input variable (X) is fed into the post-processing circuit 180T to improve the calculation precision.

FIG. 8B is its substrate-circuit layout view. The 3D-M storing the 3DM-LUT 170P comprises at least a 3D-M array 170p, as well as its X-decoder 15p and Y-decoder 17p. The 3D-M array 170p covers the pre-processing circuit 180R and the post-processing circuit 180T. Although a single 3D-M array 170p is shown in this figure, the preferred embodiment could use multiple 3D-M arrays, as those shown in FIGS. 7B-7C. Because the 3D-M array 170p does not occupy any substrate area, the 3-D integration between the 3D-M array 170p and the ALC 180 (including the pre-processing circuit 180R and the post-processing circuit 180T) leads to a smaller footprint for the computing element 110-$i$.

FIG. 8C discloses the first preferred computing element 110-$i$ which realizes a single-precision built-in function Y=f(X). The input variable X 150 has 32 bits ($x_{31} \ldots x_0$). The pre-processing circuit 180R extracts the higher 16 bits ($x_{31} \ldots x_{16}$) thereof and sends it as a 16-bit address A to the 3DM-LUT 170P. The pre-processing circuit 180R further extracts the lower 16 bits ($x_{15} \ldots x_0$) and sends it as a 16-bit residue R to the post-processing circuit 180T. The 3DM-LUT 170P comprises two 3DM-LUTs 170Q, 170R. Both 3DM-LUTs 170Q, 170R have 2 Mb capacities (16-bit input and 32-bit output): the 3DM-LUT 170Q stores the functional value D1=f(A), while the 3DM-LUT 170R stores the first-order derivative value D2=f'(A). The post-processing circuit 180T comprises a multiplier 180M and an adder 180A. The output value (Y) 190 has 32 bits and is calculated from polynomial interpolation. In this case, the polynomial interpolation is a first-order Taylor series: Y(X)=D1+D2*R=f(A)+f'(A)*R. To those skilled in the art, higher-order polynomial interpolation (e.g. higher-order Taylor series) can be used to improve the calculation precision.

When calculating a built-in function, combining the LUT with polynomial interpolation can achieve a high precision without using an excessively large LUT. For example, if only LUT (without any polynomial interpolation) is used to realize a single-precision function (32-bit input and 32-bit output), it would have a capacity of $2^{32}*32=128$ Gb, which is impractical. By including polynomial interpolation, significantly smaller LUTs can be used. In the above embodiment, a single-precision function can be realized using a total of 4 Mb LUT (2 Mb for function values, and 2 Mb for first-derivative values) in conjunction with a first-order Taylor series calculation. This is significantly less than the LUT-only approach (4 Mb vs. 128 Gb).

Figure 9A:
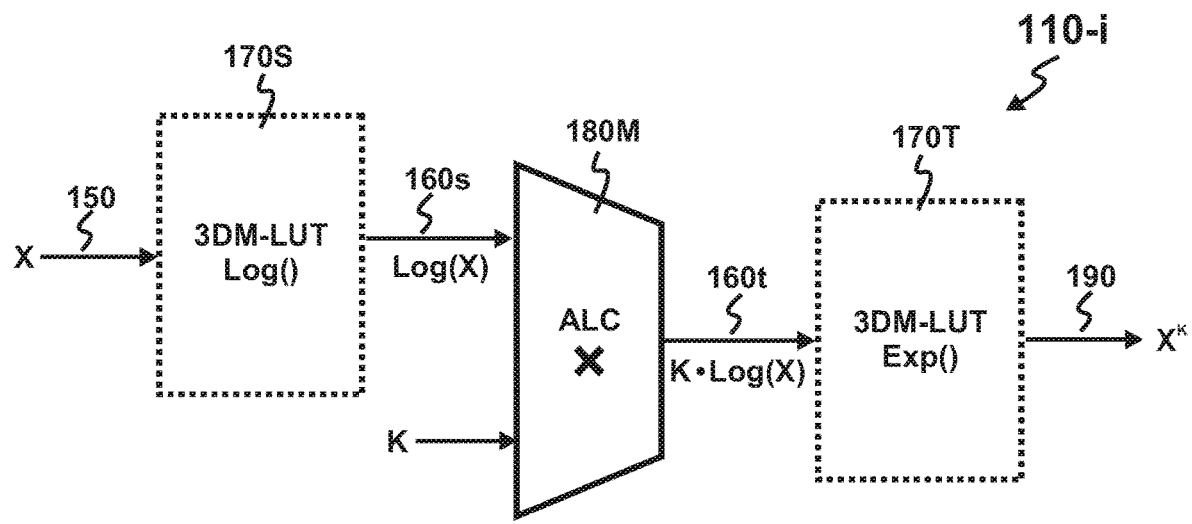
FIG. 9A is a block diagram of a second preferred computing element.
Figure 9B:
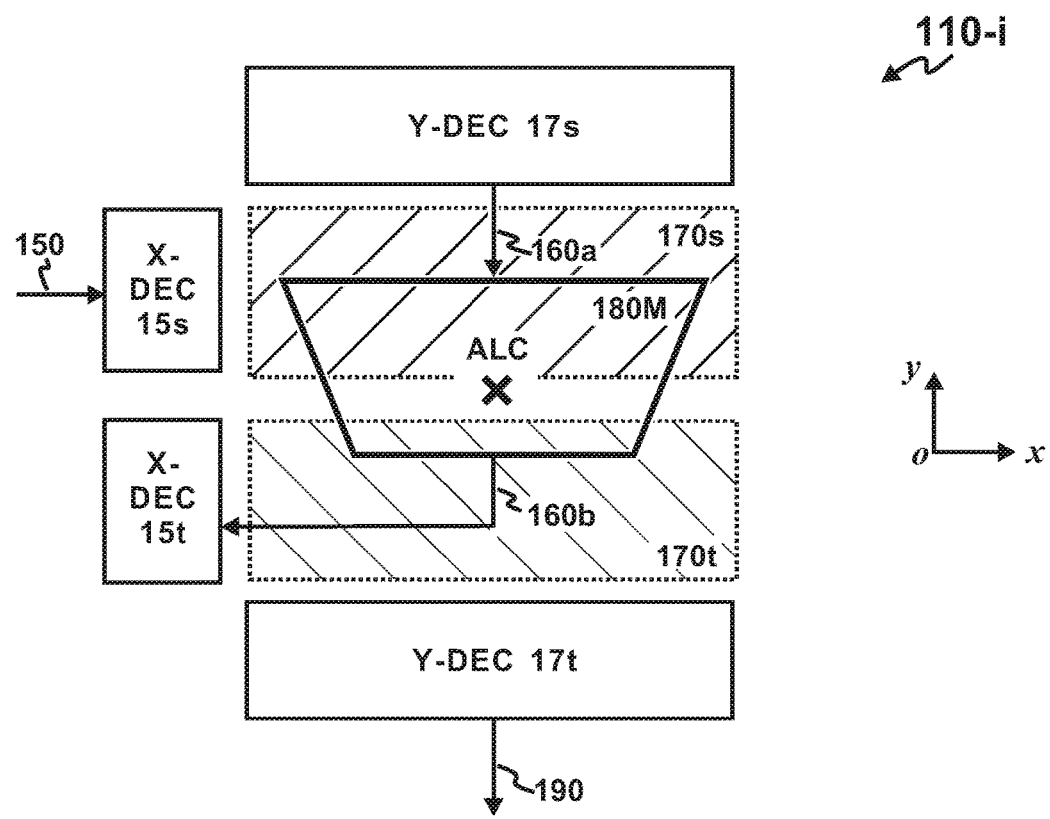
FIG. 9B is its substrate-circuit layout view.
Figure 10A:
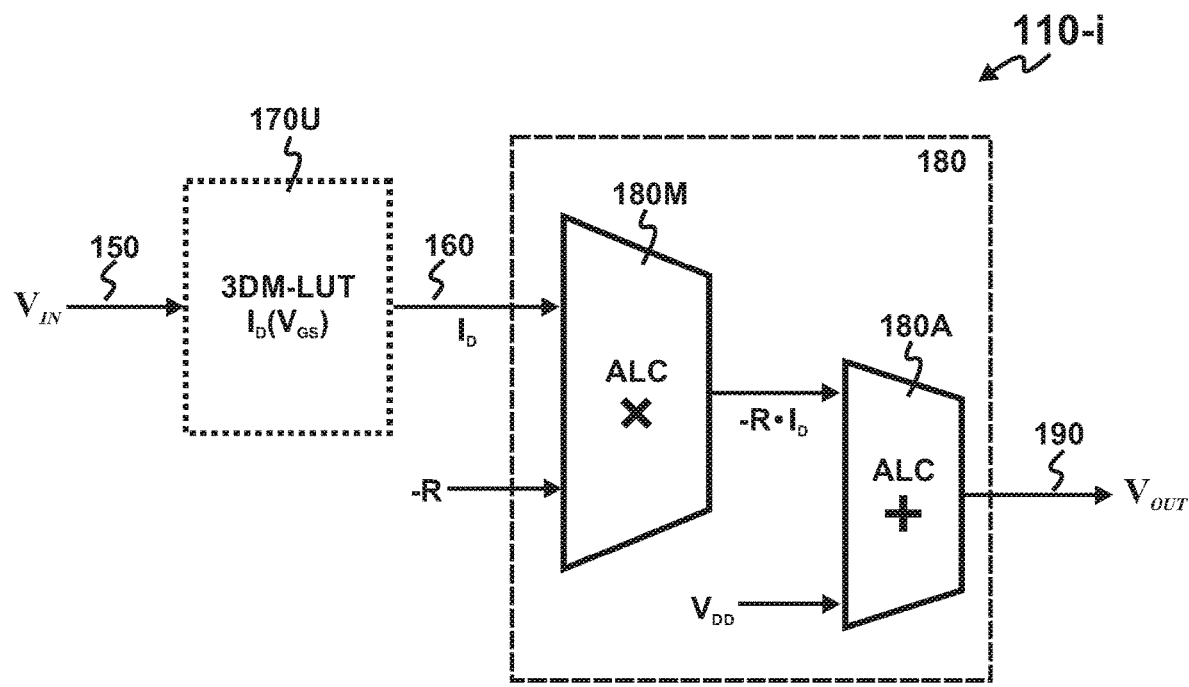
FIG. 10A is a block diagram of a third preferred computing element.
Figure 10B:
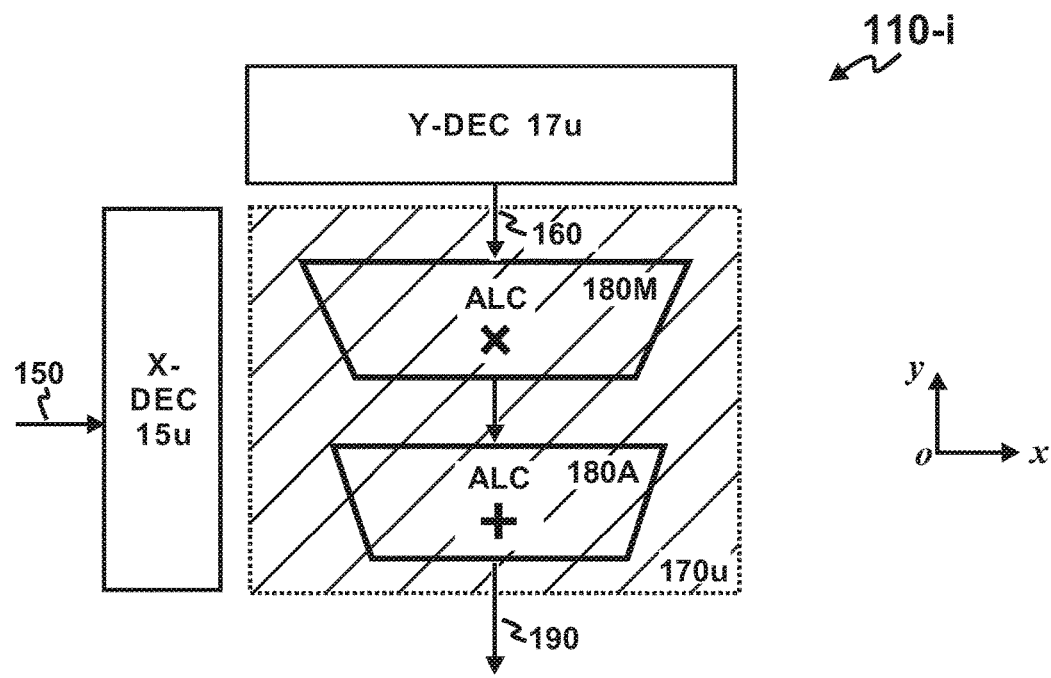
FIG. 10B is its substrate-circuit layout view.

Referring now to FIGS. 9A-9B, a second preferred computing element 110-$i$ implementing a composite function $Y=\exp[K*\log(X)]=X^K$ is disclosed. It uses the function-by-LUT method. FIG. 9A is its schematic circuit block diagram. The preferred computing element 110-$i$ comprises two 3DM-LUTs 170S, 170T and a multiplier 180M. The 3DM-LUT 170S stores the Log( ) values, while the 3DM-LUT 170T stores the Exp( ) values. The input variable X is used as an address 150 for the 3DM-LUT 170S. The output Log(X) 160$a$ from the 3DM-LUT 170S is multiplied by an exponent parameter K at the multiplier 180M. The multiplication result K*Log(X) is used as an address 160$b$ for the 3DM-LUT 170T, whose output 190 is $Y=X^K$.

FIG. 9B is its substrate-circuit layout view. The substrate circuit 0K comprises the X-decoders 15$s$, 15$t$ and the Y-decoders 17$s$, 17$t$ for the 3D-M arrays 170$s$, 170$t$, as well as a multiplier 180M. Placed side-by-side, both 3D-M arrays 170$s$, 170$t$ partially cover the multiplier 180M. Note that both embodiments in FIG. 8C and FIG. 9A comprise two 3DM-LUTs. These 3DM-LUTs could be stored in a single 3D-M array 170$p$ (as in FIG. 8B), in two 3D-M arrays 170$s$, 170$t$ placed side-by-side (as in FIG. 9B), or in two vertically stacked 3D-M arrays (i.e. on different memory levels 16A, 16B, as in FIGS. 5A-5C). Apparently, the 3DM-LUT can be stored in more 3D-M arrays.

Referring now to FIGS. 10A-10B, a third preferred computing element 110-$i$ to simulate the amplifier circuit 20 of FIG. 2A is disclosed. It uses the model-by-LUT method. FIG. 10A is its schematic circuit block diagram. The preferred computing element 110-$i$ comprises a 3DM-LUT 170U, an adder 180A and a multiplier 180M. The 3DM-LUT 170U stores the data associated with the behaviors (e.g. input-output characteristics) of the transistor 24. By using the input voltage value ($V_{IN}$) as an address 150 for the 3DM-LUT 170U, the readout 160 of the 3DM-LUT 170U is the drain-current value ($I_D$). After the $I_D$ value is multiplied with the minus resistance value (-R) of the resistor 22 by the multiplier 180M, the multiplication result (-R*$I_D$) is added to the $V_{DD}$ value by the adder 180A to generate the output voltage value ($V_{OUT}$) 190.

The 3DM-LUT 170U stores different forms of mathematical models. In one case, the mathematical model data stored in the 3DM-LUT 170U is raw measurement data, i.e. the measured input-output characteristics of the transistor 24. One example is the measured drain current vs. the applied gate-source voltage ($I_D$-$V_{GS}$) characteristics. In another case, the mathematical model data stored in the 3DM-LUT 170U is the smoothed measurement data. The raw measurement data could be smoothed using a purely mathematical method (e.g. a best-fit model). Or, this smoothing process can be aided by a physical transistor model (e.g. a BSIM4 V3.0 transistor model). In a third case, the mathematical data stored in the 3DM-LUT include not only the measured data, but also its derivative values. For example, the 3DM-LUT data include not only the drain-current values of the transistor 24 (e.g. the $I_D$-$V_{GS}$ characteristics), but also its transconductance values (e.g. the $G_m$-$V_{GS}$ characteristics). With derivative values, polynomial interpolation can be used to improve the modeling precision using a reasonable-size 3DM-LUT, as in the case of FIG. 8C.

FIG. 10B is its substrate-circuit layout view. The substrate circuit 0K comprises the X-decoder 15$u$ and the Y-decoder 17$u$ for the 3D-M array 170$u$, as well as the multiplier 180M and the adder 180A. The 3D-M array 170$u$ covers the multiplier 180M and the adder 180A. Although a single 3D-M array 170$u$ is shown in this figure, the preferred embodiment could use multiple 3D-M arrays 170$u$, as those shown in FIGS. 7B-7C.

Model-by-LUT offers many advantages. By skipping two software-decomposition steps (from mathematical models to mathematical functions, and from mathematical functions to built-in functions), it saves substantial modeling time and energy. Model-by-LUT may need less LUT than function-by-LUT. Because a transistor model (e.g. BSIM4 V3.0) has hundreds of model parameters, calculating the intermediate functions of the transistor model requires extremely large LUTs. However, if we skip function-by-LUT (namely, skipping the transistor models and the associated intermediate functions), the transistor behaviors can be described using only three parameters (including the gate-source voltage $V_{GS}$, the drain-source voltage $V_{DS}$, and the body-source voltage $V_{BS}$). Describing the mathematical models of the transistor 24 requires relatively small LUTs.

While illustrative embodiments have been shown and described, it would be apparent to those skilled in the art that many more modifications than that have been mentioned above are possible without departing from the inventive concepts set forth therein. For example, the processor could be a micro-controller, a controller, a central processing unit (CPU), a digital signal processor (DSP), a graphic processing unit (GPU), a network-security processor, an encryption/decryption processor, an encoding/decoding processor, a neural-network processor, or an artificial intelligence (AI) processor. These processors can be found in consumer electronic devices (e.g. personal computers, video game machines, smart phones) as well as engineering and scientific workstations and server machines. The invention, therefore, is not to be limited except in the spirit of the appended claims.

What is claimed is:

1. A three-dimensional processor (3D-processor) for parallel computing, comprising a single-crystalline semiconductor substrate and a plurality of computing elements including first and second computing elements disposed thereon, each of said computing elements comprising:

at least a three-dimensional memory (3D-M) array including a plurality of vertically stacked memory cells for storing at least a portion of a look-up table (LUT) for a mathematical function, wherein said memory cells are neither in contact with nor interposed by any semiconductor substrate including said single-crystalline semiconductor substrate; and, said memory cells do not comprise any single-crystalline semiconductor material;

an arithmetic logic circuit (ALC) disposed on said single-crystalline semiconductor substrate, wherein said ALC performs at least one arithmetic operation on selected data from said LUT; and, transistors in said ALC comprise at least a single-crystalline semiconductor material;

a plurality of inter-storage-processor (ISP) connections entirely disposed between said 3D-M array and said single-crystalline semiconductor substrate for communicatively coupling said memory cells and said single-crystalline semiconductor substrate, wherein said ISP-connections do not penetrate through any semiconductor substrate including said single-crystalline semiconductor substrate;

wherein said first and second computing elements calculate the values of respective mathematical function in parallel.

2. The processor according to claim 1, wherein said memory cells comprise at least a poly-crystalline or amorphous semiconductor material.

3. The processor according to claim 1, wherein said LUT includes functional values or derivative values of said mathematical function.

4. The processor according to claim 1, wherein said mathematical function includes more operations than arithmetic operations performable by said ALC.

5. The processor according to claim 1, wherein said mathematical function represents a mathematical model.

6. The processor according to claim 5, wherein said LUT includes raw measurement data or smoothed measurement data.

7. The processor according to claim 1, wherein said ALC comprises at least an adder, a multiplier, a multiply-accumulator (MAC), a pre-processing circuit, or a post-processing circuit.

8. The processor according to claim 1, wherein said ISP-connections comprise a plurality of contact vias.

9. The processor according to claim 1, wherein said 3D-M array and said ALC at least partially overlap.

10. The processor according to claim 1, wherein said 3D-M array is a horizontal 3D-M (3D-$M_H$) array.

11. The processor according to claim 1, wherein said 3D-M array is a vertical 3D-M (3D-$M_V$) array.

12. A three-dimensional processor (3D-processor) for parallel computing, comprising a single-crystalline semiconductor substrate and a plurality of computing elements including first and second computing elements disposed thereon, each of said computing elements comprising:
  at least a three-dimensional vertical memory (3D-$M_V$) array including a plurality of vertically stacked memory cells for storing at least a portion of a look-up table (LUT) for a mathematical function, wherein said memory cells are neither in contact with nor interposed by any semiconductor substrate including said single-crystalline semiconductor substrate; and, said memory cells do not comprise any single-crystalline semiconductor material;
  an arithmetic logic circuit (ALC) disposed on said single-crystalline semiconductor substrate, wherein said ALC performs at least one arithmetic operation on selected data from said LUT; and, transistors in said ALC comprise at least a single-crystalline semiconductor material;
  a plurality of inter-storage-processor (ISP) connections entirely disposed between said 3D-$M_V$ array and said single-crystalline semiconductor substrate for communicatively coupling said memory cells and said single-crystalline semiconductor substrate, wherein said ISP-connections do not penetrate through any semiconductor substrate including said single-crystalline semiconductor substrate;
  wherein said first and second computing elements calculate the values of respective mathematical function in parallel.

13. The processor according to claim 12, wherein said memory cells comprise at least a poly-crystalline or amorphous semiconductor material.

14. The processor according to claim 12, wherein said LUT includes functional values or derivative values of said mathematical function.

15. The processor according to claim 12, wherein said mathematical function includes more operations than arithmetic operations performable by said ALC.

16. The processor according to claim 12, wherein said mathematical function represents a mathematical model.

17. The processor according to claim 16, wherein said LUT includes raw measurement data or smoothed measurement data.

18. The processor according to claim 12, wherein said ALC comprises at least an adder, a multiplier, a multiply-accumulator (MAC), a pre-processing circuit, or a post-processing circuit.

19. The processor according to claim 12, wherein said ISP-connections comprise a plurality of contact vias.

20. The processor according to claim 12, wherein said 3D-M array and said ALC at least partially overlap.

\* \* \* \* \*